US011024795B2

(12) United States Patent
Robert et al.

(10) Patent No.: US 11,024,795 B2
(45) Date of Patent: Jun. 1, 2021

(54) REDUCING PARASITIC CAPACITIES IN A MICROELECTRONIC DEVICE

(71) Applicant: COMMISSARIAT A L'ENERGIE ATOMIQUE ET AUX ENERGIES ALTERNATIVES, Paris (FR)

(72) Inventors: Philippe Robert, Grenoble (FR); Stephanus Louwers, La Buisse (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 16/467,617

(22) PCT Filed: Dec. 8, 2017

(86) PCT No.: PCT/EP2017/082093
§ 371 (c)(1),
(2) Date: Jun. 7, 2019

(87) PCT Pub. No.: WO2018/108753
PCT Pub. Date: Jun. 21, 2018

(65) Prior Publication Data
US 2019/0312192 A1     Oct. 10, 2019

(30) Foreign Application Priority Data
Dec. 12, 2016   (FR) .................................. 16 62276

(51) Int. Cl.
*H01L 41/113*   (2006.01)
*H01L 41/047*   (2006.01)
(Continued)

(52) U.S. Cl.
CPC ........ *H01L 41/1132* (2013.01); *B81B 3/0086* (2013.01); *H01L 41/0475* (2013.01);
(Continued)

(58) Field of Classification Search
CPC . H01L 41/1132; H01L 41/0475; H01L 41/29; H01L 41/332; H01L 41/35;
(Continued)

(56) References Cited

U.S. PATENT DOCUMENTS

| 5,663,588 A | 9/1997 | Suzuki et al. |
| 6,104,054 A | 8/2000 | Corsi et al. |

(Continued)

FOREIGN PATENT DOCUMENTS

JP     7-297273  A    11/1995

OTHER PUBLICATIONS

International Search Report dated Feb. 20, 2018 in PCT/EP2017/082093 filed on Dec. 8, 2017.

*Primary Examiner* — Shahed Ahmed
(74) *Attorney, Agent, or Firm* — Oblon, McClelland, Maier & Neustadt, L.L.P.

(57) ABSTRACT

A microelectronic device including a substrate including, in a stack, a base portion, a dielectric portion and an upper layer with a semi-conductive material base, at least one electrical connection element made of an electrically conductive material located above the upper layer and electrically insulated from the upper layer at least by a dielectric layer, the dielectric layer being in contact with the surface of the upper layer, at least one dielectric element including at least one trench forming a closed edge at the periphery or upright of at least one portion of the dielectric electrical connection element, located at least partially in the upper layer and delimiting a closed zone of said upper layer, at least one dielectric element having a portion exposed to the surface of the upper layer, device wherein the dielectric layer totally covers the exposed portion of at least one dielectric element.

22 Claims, 10 Drawing Sheets

(51) Int. Cl.
- *H01L 41/29* (2013.01)
- *H01L 41/332* (2013.01)
- *H01L 41/35* (2013.01)
- *B81B 3/00* (2006.01)

(52) U.S. Cl.
CPC ............ *H01L 41/29* (2013.01); *H01L 41/332* (2013.01); *H01L 41/35* (2013.01); *B81B 2207/07* (2013.01)

(58) Field of Classification Search
CPC .............. B81B 3/0086; B81B 2207/07; B81C 1/00007; B81C 1/00–0092; B81C 3/00–008; B81C 99/00–0095; B81C 2201/00–117; B81C 2203/00–0792
See application file for complete search history.

(56) References Cited

U.S. PATENT DOCUMENTS

| | | |
|---|---|---|
| 2002/0140033 A1 | 10/2002 | Bae et al. |
| 2003/0020120 A1 | 1/2003 | Ye et al. |
| 2006/0194411 A1 | 8/2006 | Hargrove |
| 2006/0286706 A1* | 12/2006 | Salian ................ B81C 1/00301 438/50 |
| 2007/0090474 A1* | 4/2007 | Li ........................ B81B 3/0078 257/414 |
| 2007/0298578 A1 | 12/2007 | Khater et al. |
| 2011/0147859 A1 | 6/2011 | Tanaka et al. |
| 2012/0279299 A1* | 11/2012 | Walther ............. G01C 19/5762 73/504.02 |
| 2014/0048922 A1 | 2/2014 | Tanaka et al. |
| 2015/0078590 A1* | 3/2015 | Daley ................. H04R 17/005 381/190 |

\* cited by examiner

A-A

B-B

Detail C

D-D

D-D

E-E

E-E

F-F

REDUCING PARASITIC CAPACITIES IN A MICROELECTRONIC DEVICE

FIELD OF THE INVENTION

The present invention generally relates to microelectronic devices. In particular, it relates to devices having portions, such as tracks made of electrically conductive materials, likely to drive electrical signals.

By microelectronic device, this means any type of device produced with microelectronic means. These devices comprise, in particular, in addition to devices for a purely electronic purpose, micromechanical or electromechanical devices (MEMS, NEMS, etc.), as well as optical or optoelectronic devices (MOEMS, NOEMS, etc.). These can be transducers, for example having a function of transforming sound into an electrical signal, for a microphone application, in particular.

TECHNOLOGICAL BACKGROUND

Microelectronics is used in numerous applications with an increasing functioning miniaturisation and finesse. In the case of sensors for example, very thin sensitive layers can be used and measuring signals are low current values. Under these conditions, it occurs that electrical parameters surrounding the active component(s) of the device become significant in the electrical processing of measuring signals. One difficulty is, in particular, posed by parasitic capacities: electrically conductive portions and dielectric zones forming, with the semi-conductive substrate (generally silicon); capacitive stacks risking disrupting the measurements. These parasitic capacities can be found also in the wide dimension of the device, perpendicular to the thickness of the semi-conductive substrate.

It has already been sought to resolve the problem of parasitic capacities. For example, publication U.S. Pat. No. 6,104,054A1 shows a method for reducing parasitic capacities in an integrated circuit formed on a support based on a Silicon-On-Insulator-type substrate, generally known under the acronym SOI. Insulating trenches made of silicon dioxide form, in association with the insulating layer of the SOI, electrical insulation boxes of a central portion of the box, wherein is located an active transistor portion. These trenches ensure the function of dielectric gap layers so as to create capacities in series with parasitic capacities. This combination of capacities in series reduces the overall value. Indeed, the resulting capacity Cr is equal to: $Cr=1/(1/C1+1/C2)$ where C1 is the parasitic capacity and C2 is an additional capacity created by a trench. It is understood that Cr is necessarily less than C1 (and less than C2), thus reducing the parasitic effects.

If this arrangement of trenches is satisfactory in the effect thereof of reducing parasitic capacities, it remains difficult to implement in an overall production method, in particular because the trenches weaken the substrate and make it sensitive to chemical attacks.

It is therefore an aim of the invention that to overcome at least partially the disadvantages of the current techniques, by offering an improved microelectronic device reducing the parasitic capacities.

SUMMARY OF THE INVENTION

A non-limiting aspect of the invention relates to a microelectronic device comprising:

a substrate comprising, in a stack, a base portion, a dielectric portion and an upper layer with a semiconductive material base,
  at least one electrical connection element made of an electrically conductive material located above the upper layer and electrically insulated from the upper layer at least by one dielectric layer, the dielectric layer being in contact with the surface of the upper layer,
  at least one dielectric element comprising at least one trench forming a closed edge at the periphery or to the right of, which can be equivalently said upright of, at least one portion of the electrical connection element, located at least partially in the upper layer and delimiting a closed zone of said upper layer, the at least one dielectric element having a portion exposed to the surface of the upper layer,
  device wherein the dielectric layer totally covers the exposed portion of the at least one dielectric element.

Thus, the dielectric layer and the dielectric element(s) form an integral and consistent assembly, making it possible to effectively insulate the electrical connection element; they create additional capacities being used to reduce the parasitic capacities produced inevitably by the electrical connection element above the semi-conductive layer. Indeed, these additional capacities are placed in series from the parasitic layers and therefore tend to reduce the overall capacity which results from this.

It will be noted, that this assembly comprising the dielectric layer and the dielectric element(s) extend to both in the dimension of the substrate and according to the thickness thereof such that the parasitic capacities are increased in these two directions. From a production standpoint, the dielectric elements made of oxide, typically silicon oxide, can easily be produced, without risking damaging them during other production phases; indeed, they are protected by the dielectric layer which is advantageously resistant to the etching of the oxide. For example, the method can comprise phases of releasing mechanical portions (in particular, mobile sensor portions) by etching oxide zones, but these phases will not negatively impact the integrity of the dielectric elements.

Another separable aspect of the present invention relates to a method for producing a microelectronic device comprising a substrate comprising, in a stack, a base portion, a dielectric portion and an upper layer with a semi-conductive material base.

Advantageously, it is characterised in that it comprises:
  the formation of at least one dielectric element located at least partially in the upper layer, the at least one dielectric layer having a portion exposed to the surface of the upper layer, said at least dielectric element, comprising at least one trench delimiting a closed zone of said upper layer, at the periphery or to the right of, which can be equivalently said upright of, at least one portion of the electrical connection element;
  the formation of a dielectric layer in contact with the surface of the upper layer and which totally covers the exposed portion of the at least one dielectric element;
  the formation of at least one electrical connection element made of an electrically conductive material above the upper layer and electrically insulated from the upper layer at least by the dielectric layer.

Preferably, the method comprises the formation of at least one zone made of a sacrificial material in the upper layer, then the etching of the sacrificial material while the at least one dielectric element is covered by the dielectric layer.

Preferably, the method comprises the formation of at least one zone made of a sacrificial material carried out before the formation of the dielectric layer, simultaneously to the formation of the at least one dielectric element.

Preferably, the method comprises the formation of the dielectric layer comprising a solid plate deposition then an etching configured to preserve the material of the dielectric layer above the at least one dielectric element without preserving the material of the dielectric layer (40) above the zone made of a sacrificial material.

BRIEF INTRODUCTION OF THE FIGURES

Other characteristics, aims and advantages of the present invention will appear upon reading the following detailed description, regarding the appended drawings, given as non-limiting examples, and wherein.

Figure 7:
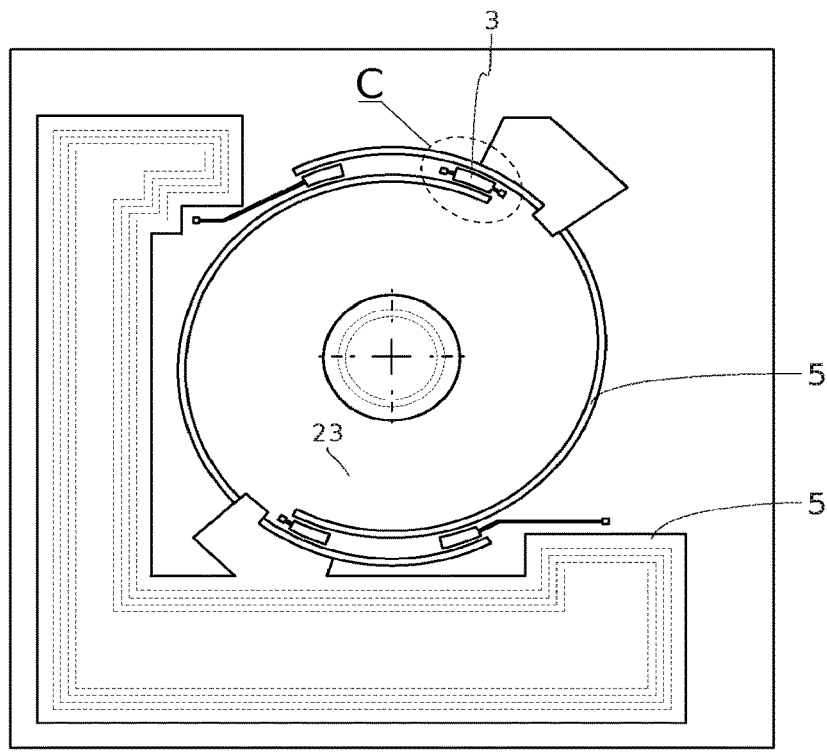
FIG. 7 shows a step of forming a lower electrode.
Figure 8A:
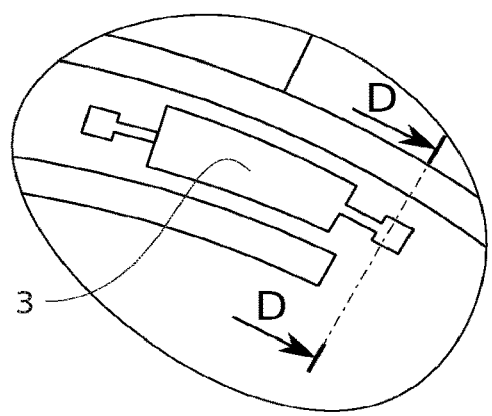
Figure 8B:
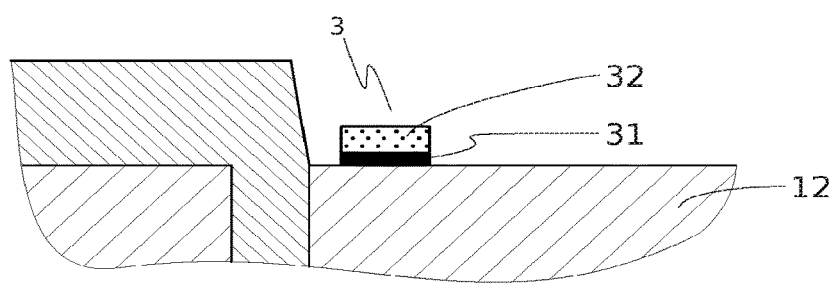
Figure 9:
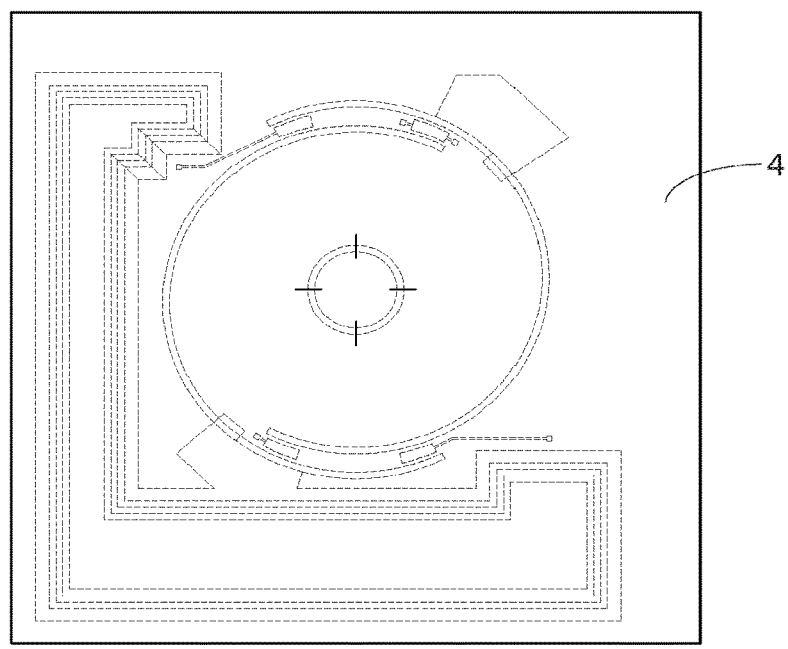
Figure 10:
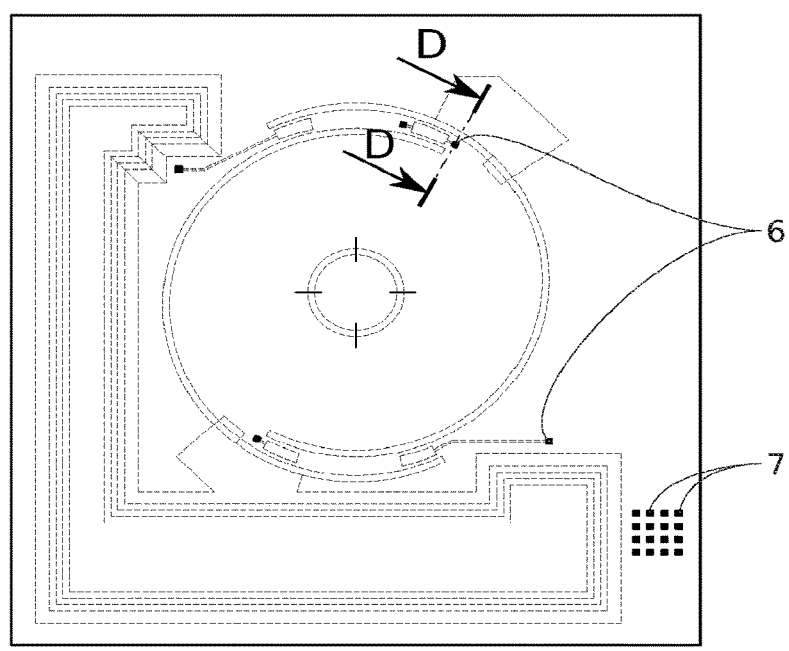
Figure 11:
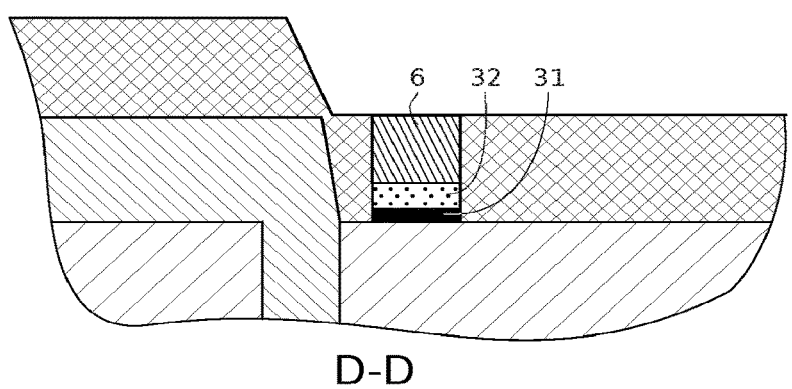
Figure 12:
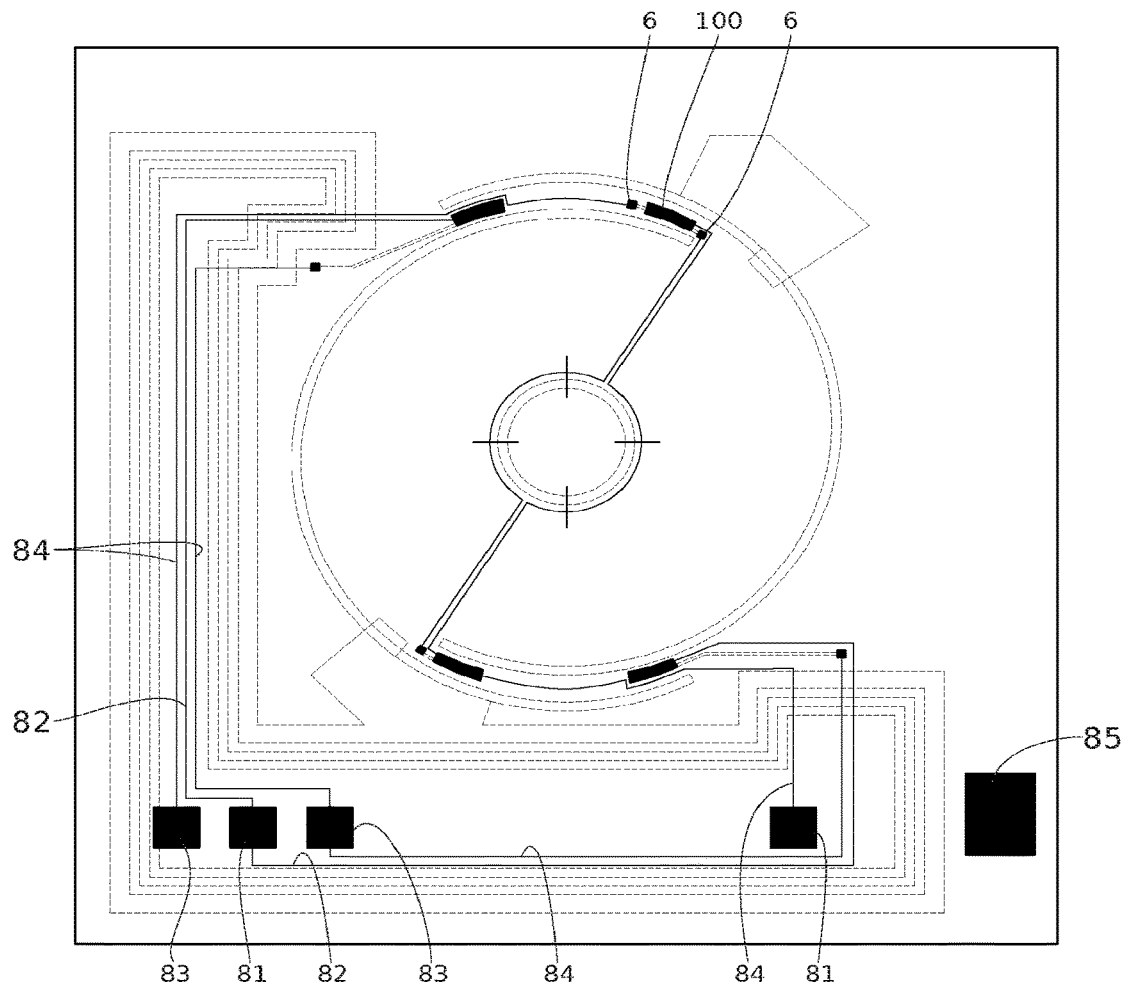
Figure 13A:
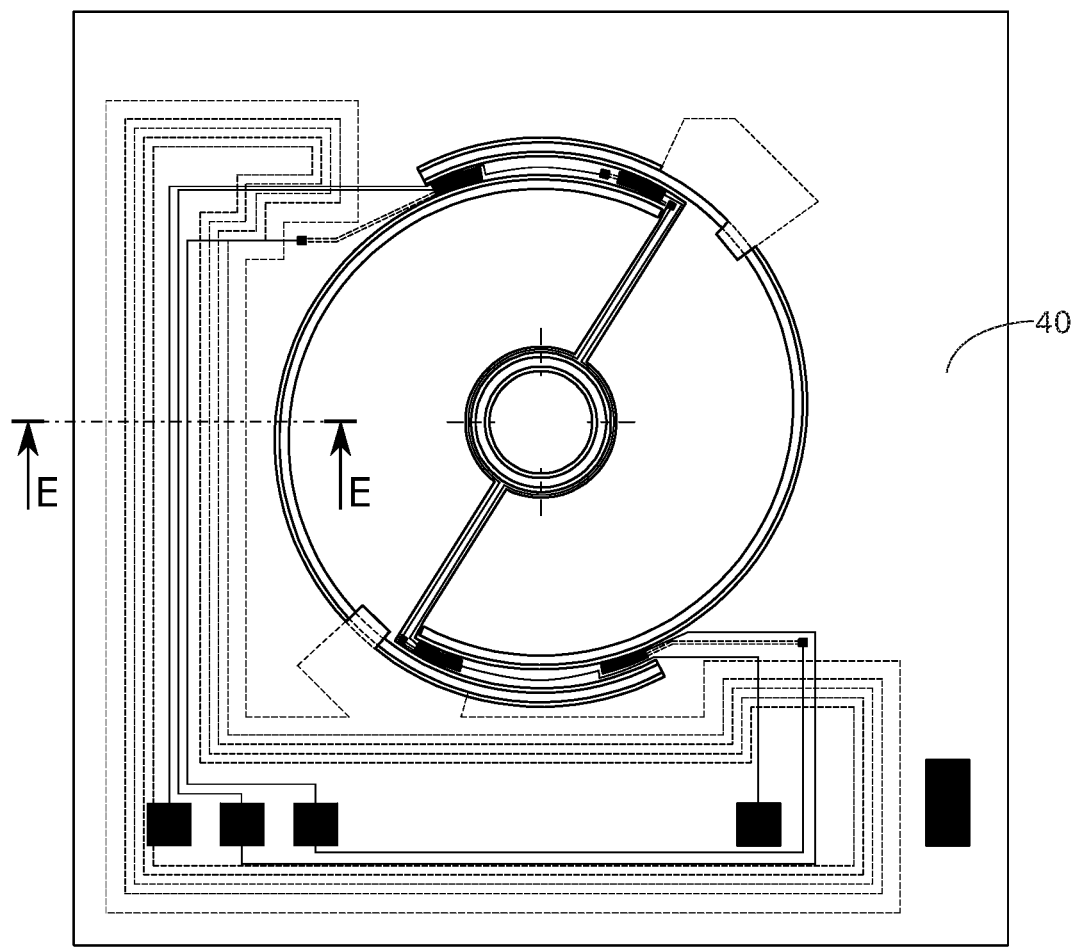
Figure 13B:
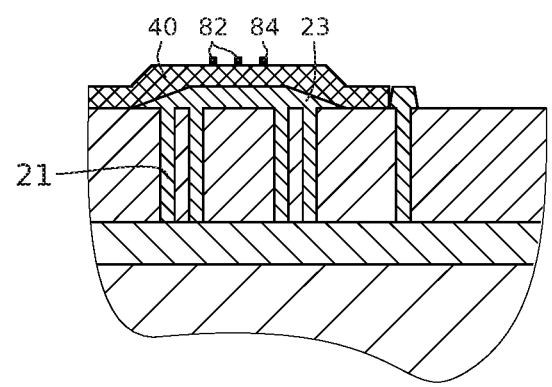
Figure 14:
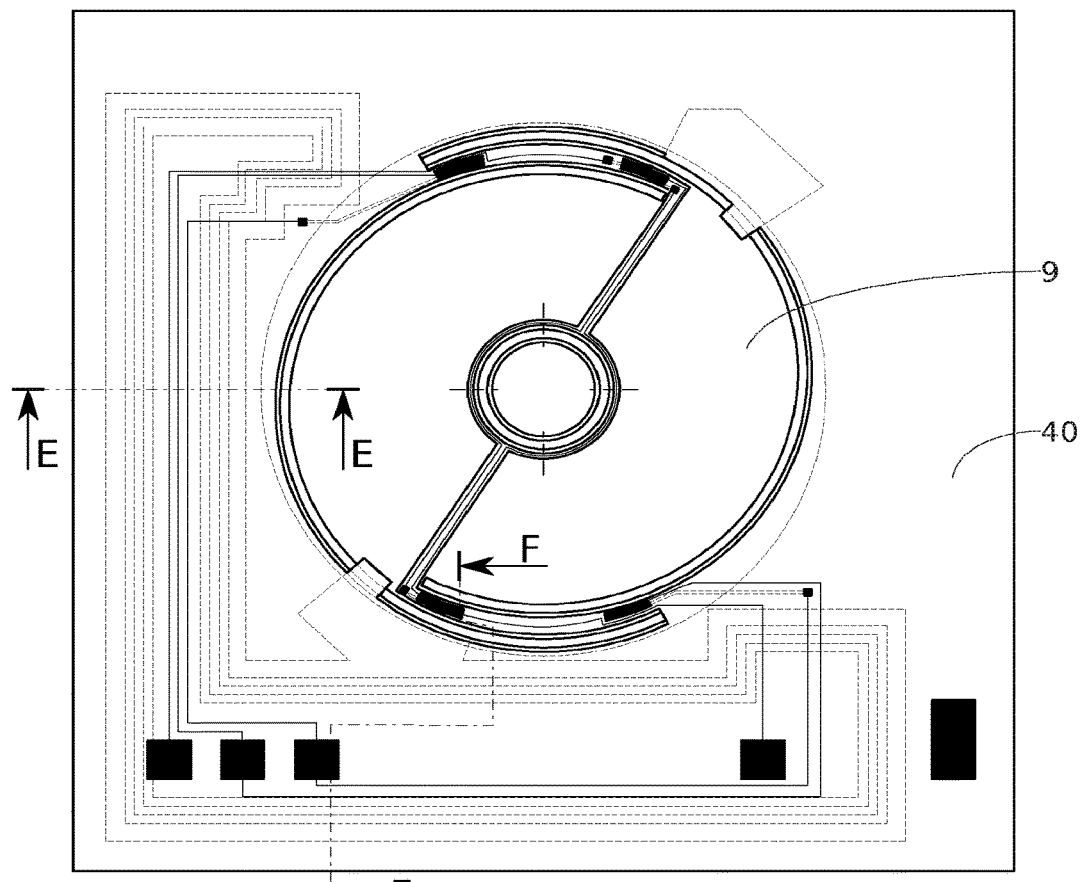
Figure 15:
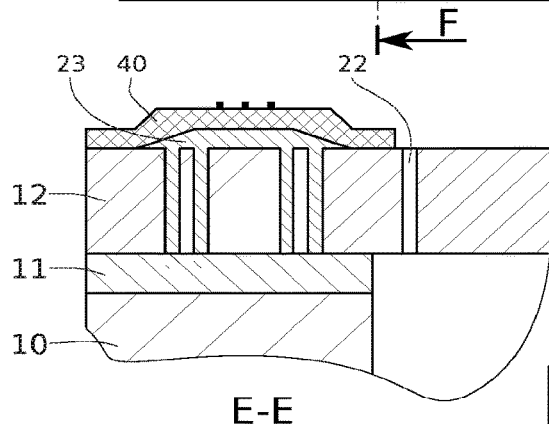
Figure 16:
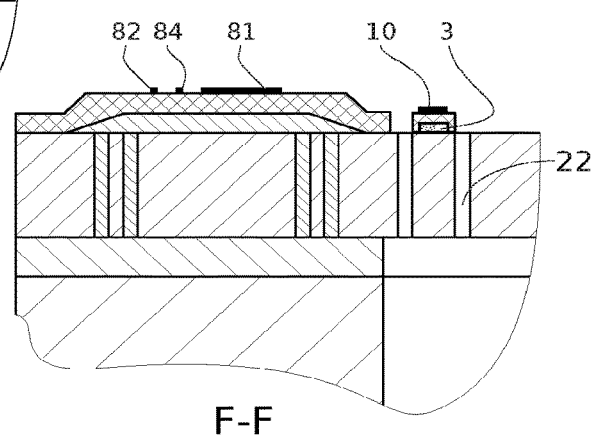
Figure 17:
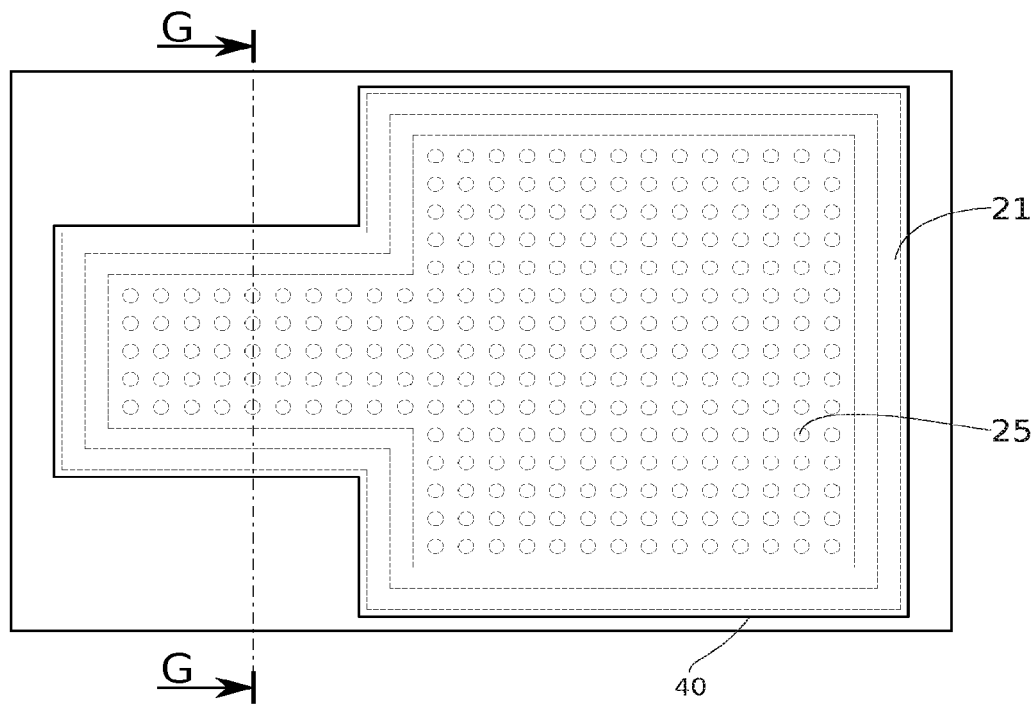
Figure 18:
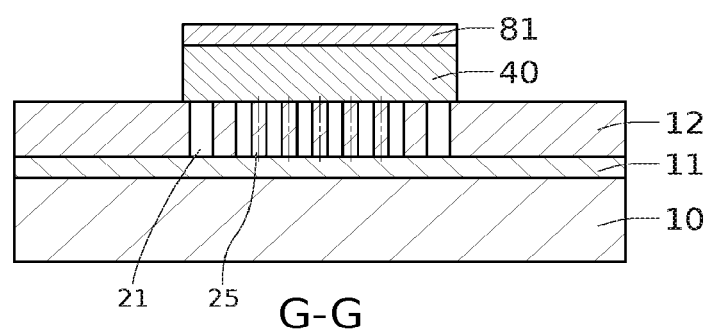

FIGS. 8a and 8b respectively show an enlarged portion C of FIG. 7 and a cross-sectional view D-D within this enlarged portion C of FIG. 7;

FIG. 9 schematises a covering by a dielectric layer, for example, piezoelectric;

FIG. 10 shows the production of openings in the dielectric layer;

FIG. 11 shows a cross-sectional view D-D of a portion of FIG. 10 and is consistent with the depiction shown in FIG. 8 for the production of vias;

FIG. 12 relates to a step of forming electrical connection elements;

FIG. 13a illustrates a partial removal of the dielectric layer so as to expose certain zones of the surface of the substrate while leaving other portions covered;

FIG. 13b is a cross-section of FIG. 13a;

FIG. 14 has a step of releasing portions according to the thickness of the substrate;

FIGS. 15 and 16 respectively show cross-sectional views E-E and F-F of a portion of FIG. 14;

FIGS. 17 and 18 give a first example of formation of dielectric elements; and

Figure 19:
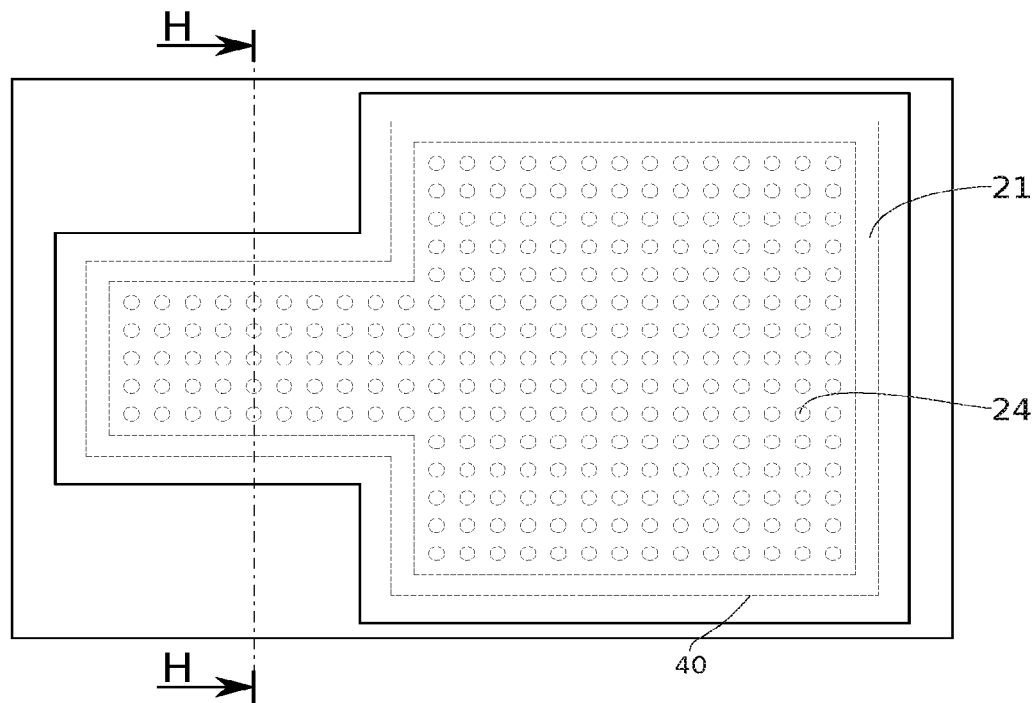
Figure 20:
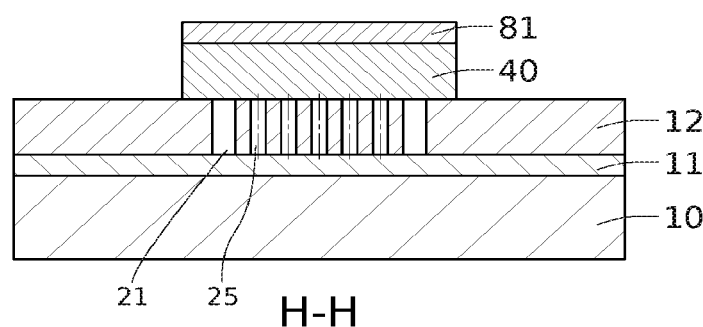

FIGS. 19 and 20 show alternative examples of the formation of dielectric elements.

The drawings are given as examples and are not limiting of the invention. They constitute schematic, principle representations intended to facilitate the understanding of the invention and are not necessarily to the scale of practical applications.

DETAILED DESCRIPTION

Before starting a detailed review of embodiments of the invention, optional characteristics are stated below, which can possibly be used according to any association or alternatively:

the at least one dielectric element 2 and the dielectric layer 40 are made of different materials;

the at least one dielectric element 2 is made of silicon dioxide and the dielectric layer 40 is resistant to a hydrofluoric acid etching;

at least one electrical connection element is in electrical continuity with a first electrode 100 of a capacitive stack;

the capacitive stack comprises a second electrode 3 located below a portion of the dielectric layer 40, at least one portion of the first electrode being located facing the second electrode and insulated from this by said portion of the dielectric layer 40;

a dielectric sublayer 31 is located between the upper layer 12 and the second electrode 3.

This embodiment is useful, in particular in the case of piezoelectric applications wherein the layer 40 is a piezoelectric layer. The layer 31 (generally made of AlN) makes it possible to obtain an orientation of grains of the layer 40 optimising the piezoelectric properties thereof.

an additional electrical connection element made of an electrically conductive material is located above the upper layer 12 and electrically insulated from the upper layer 12 at least by a zone of the dielectric layer 40, the additional electrical connection element being in electrical continuity with the second electrode 3 by a via 6 passing through the dielectric layer 40;

the dielectric layer 40 is of piezoelectric nature;

the at least one dielectric element 2 comprises at least one pillar 24 of which the long dimension extends at least according to one portion at least of the thickness of the upper layer 12;

at least one pillar 24 is located facing the connection element under the dielectric layer 40;

at least one dielectric element 2 comprises a network of trenches defined as hollow in the thickness of the upper layer 12 around a plurality of pillars 25 extending into the thickness of the upper layer 2;

at least one pillar 25 is located facing the connection element under the dielectric layer;

the at least one dielectric element 2 comprises a trench 21 forming a closed edge at the periphery or to the right of, which can be equivalently said upright of, at least one portion of the electrical connection element;

the at least one dielectric element 2 comprises a plurality of trenches 21, 22;

at least one trench 21 surrounds at least one pillar 24;

at least one trench 21 surrounds at least one pillar 25;

the at least one dielectric element 2 comprises a first portion located in the upper layer 12 and a second portion 23 located above the upper layer;

the electrical connection element comprises a connection pad;

the dielectric layer 40 is wider than the electrical connection element and at least one dielectric element 2 is located facing a portion of the dielectric layer 40 not covered by the connection element;

the dielectric element 2 passes through the whole thickness of the upper layer 12 and joins the dielectric portion 11.

It is specified that, in the scope of the present invention, the term "on" or "above" does not compulsorily mean "in contact with". Thus, for example, the deposition of a layer on another layer, does not compulsorily mean that the two layers are directly in contact with one of the other, but this means that one of the layers covers at least partially the other, by being either directly in contact with it, or by being separated from it by a film, also another layer or another element. A layer can moreover be composed of several sublayers made of one same material or of different materials.

It is specified that in the scope of the present invention, the thickness of a layer or of a substrate is measured along a direction perpendicular to the surface according to which this layer or this substrate has the maximum extension thereof.

A support, for example with a base of a substrate, in particular, semi-conductive can be common to several devices of the invention at least during the production. A plurality of devices will be generally produced on this support. A cut will follow to individualise the devices.

Certain portions of the device of the invention have an electrical function. Some are used for electrical conduction properties and by electrode (or equivalent), this means elements formed of at least one material having a sufficient conductivity, in the application, to achieve the desired function. It is the case, generally, for the portions called electrical connection elements; this can be pads, electrodes, electrical redistribution lines, etc. Other portions, on the contrary, are used for electrical insulation properties and any material having a sufficient resistivity to achieve this insulation, are concerned and are, in particular, called dielectric.

Figure 1:
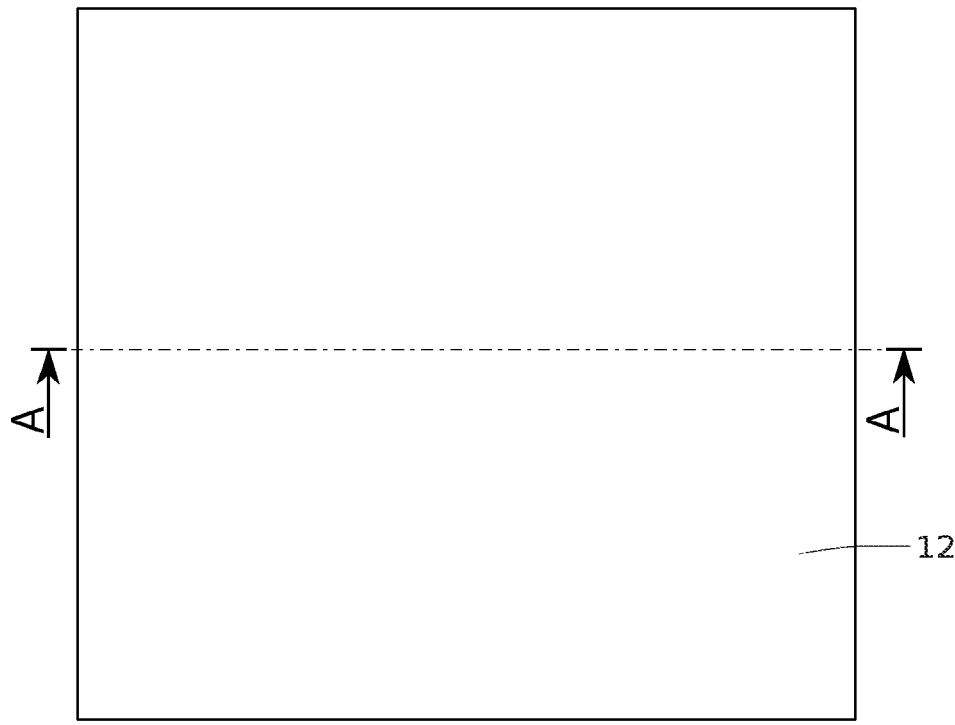
FIGS. 1 and 2 illustrate respectively, as a top and cross-sectional view, a base substrate example of the invention, according to SOI technology.
Figure 2:
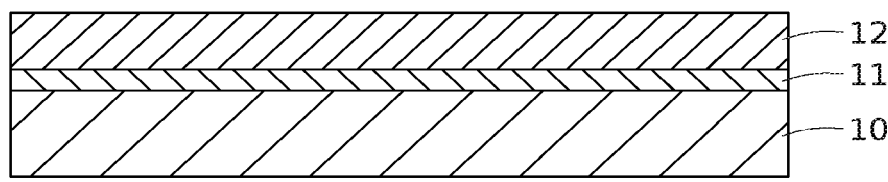

The present invention can be implemented from a conventional-type substrate and in particular, from a substrate using Silicon On Insulator, or SOI technology. The representation of FIGS. 1 and 2 correspond to this latter example. In FIG. 2, a substrate 1 comprises a base portion 10, for example made of crude silicon, a dielectric portion 11 located above the portion 10 and, for example, made from an insulating semi-conductive material, typically silicon dioxide. Above the dielectric portion 11, an upper layer 12 is present, with a semi-conductive material base, typically of monocrystalline silicon. FIG. 1 only illustrates the upper face of this stack, which is at this stage, only constituted of this semi-conductive material.

Figure 3:
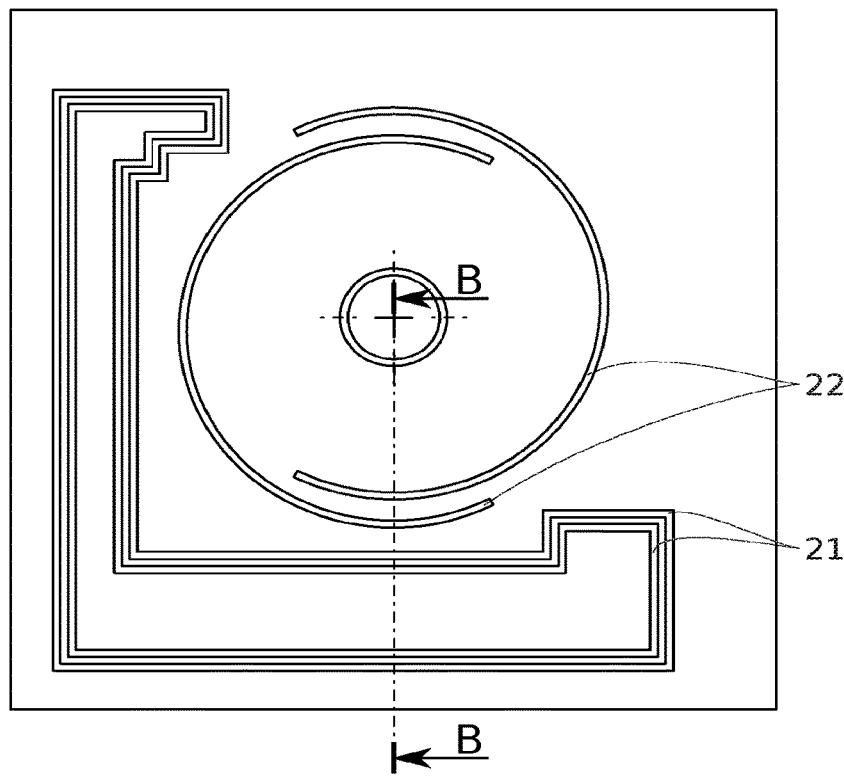
FIGS. 3 and 4 show respectively, as a top and cross-sectional view, a step of forming trenches in the upper layer of the substrate.
Figure 4:
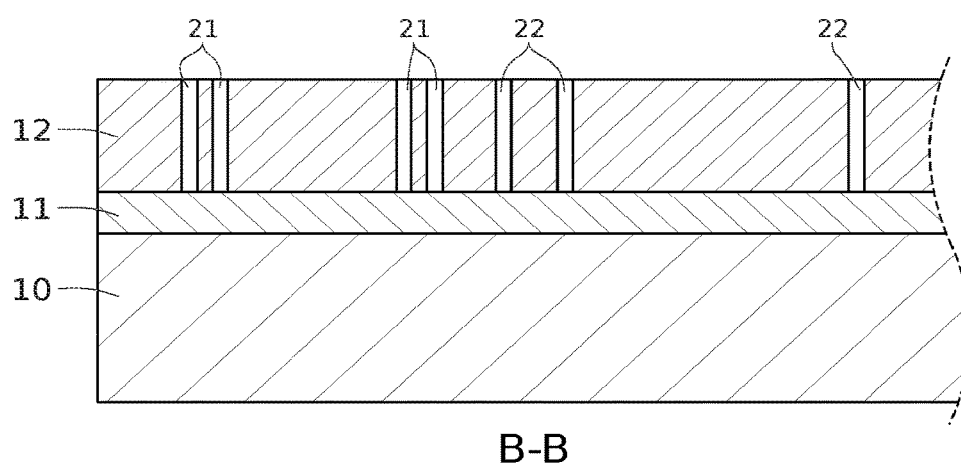

An embodiment step of the invention consists of forming trenches in the layer. Thus, FIG. 3 illustrates trenches 21 produced over a predetermined zone of the upper layer 12. Advantageously, as FIG. 4 shows, the depth of the trenches 21 corresponds to the thickness of the upper layer 12 such that the trenches reach up to the dielectric portion 11. It will be seen, that these trenches 21 are used to produce insulating trenches filled with a dielectric material. At the same time, other trenches 22 can be produced for other portions of the process for producing the targeted microelectronic device. In this case, trenches 22 are also produced to later release certain portions of the upper layer 12, these portions could in particular be intended to inform the mobile portions of a mechanical microelectronic device. The technique for producing trenches is not limiting of the invention and, in particular, any type of etching can be implemented, for example, by dry operation or by wet operation. The trench(es) 22 are preferably not covered by the dielectric layer 40 and do not contribute to the dielectric elements. The trench(es) 22, thus formed in at least the layer 12, preferably define the edge of a portion which will be mobile after etching an underlying portion of the layer 11.

The shape and the number of trenches 22 depend on the type of microelectronic device to be produced. Concerning the trenches 21, one or more trenches can be formed; these trenches can furthermore have, as in the example of FIG. 3, a closed edge so as to girdle a specific portion of the upper layer 12. In the case of FIGS. 3 and 4, two trenches of homothetic profile are produced on a portion of the upper layer 12 extending to the level of two sides of said substrate.

Generally, it is advantageous to form the trenches 22 in a portion of the upper layer 12 at the level of which a density of electrical connection elements (re-contact pads, redistribution lines, etc.) is significant.

Figure 5:
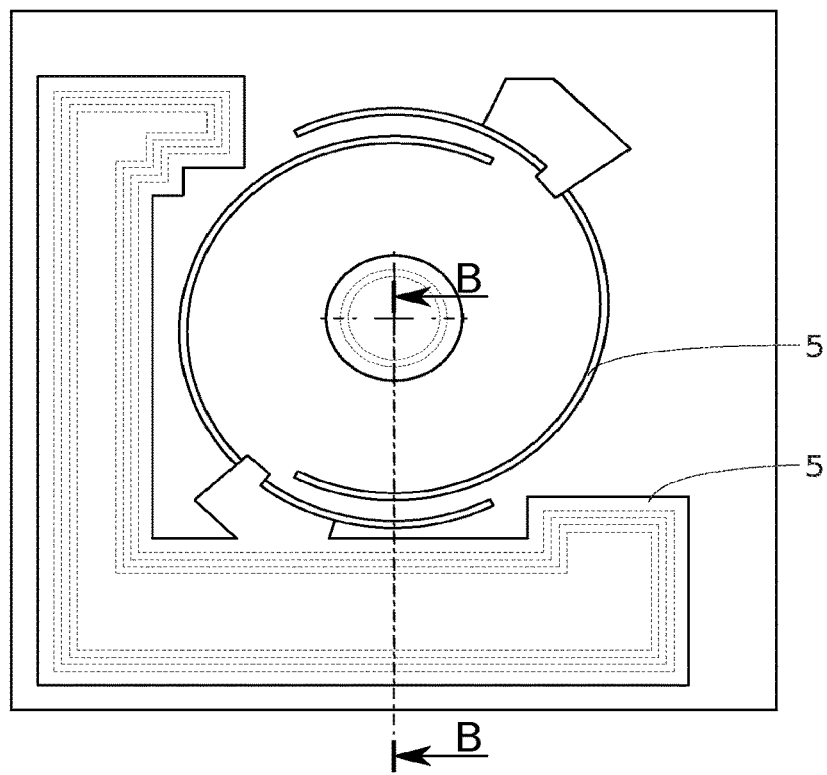
FIGS. 5 and 6 show respectively, as a top and cross-sectional view, a step of forming oxide portions in the trenches, thus giving an embodiment example of dielectric elements and of sacrificial material zones.
Figure 6:
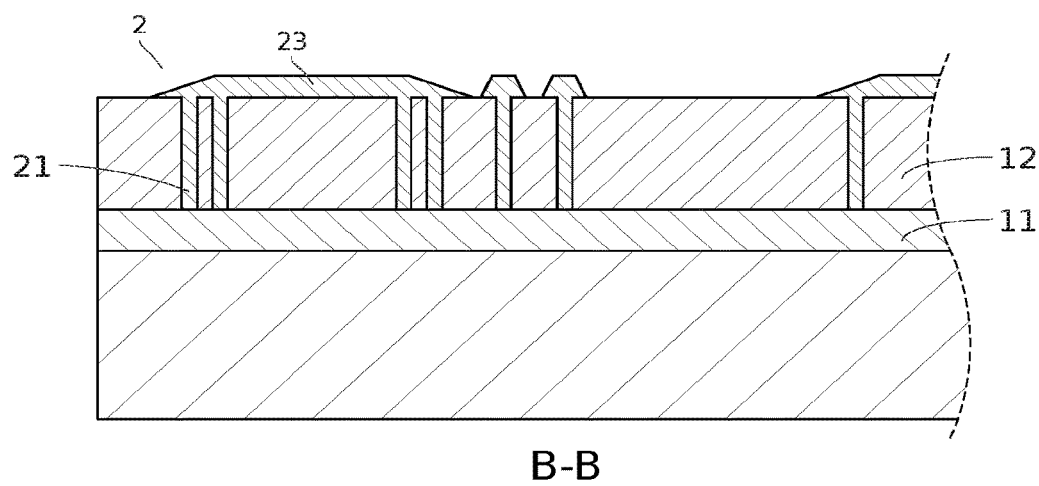

FIG. 5 illustrates the formation of a filling with an electrically insulating material of the trenches produced beforehand. Preferably, the material used is an oxide, in particular silicon oxide deposited from the face of the upper layer 12, possibly by any conventional techniques and, for example, by thermal oxidation after masking of the zones of the upper layer 12 of which the covering or the filling by the oxide is not desired. FIG. 5 illustrates the zones at the level of which the dielectric material is deposited. Typically, it can be of the inner volume of the trenches 22 and the trenches 21. Advantageously, a surface portion of the upper layer 12 is also covered with oxide. FIG. 6 gives an illustration of it with a filling of the trenches 21 and a portion of the surface of the upper layer 12. The filling of the trenches 21 and of the surface portion advantageously forms a consistent and continuous assembly, these two portions being produced from one single holding during the oxidation operation. Thus, according to a first embodiment, dielectric elements located, in this case, partially in the portion inside the upper layer 12 and partially on the surface of it, are formed. By referring to FIG. 5, the surface portion of the oxide layer fully covers the edge defined by the trenches 21 and, FIG. 6 illustrates the surface portion of the oxide which exceeds laterally, the closed edge thus defined. The trench of the surface portion of the dielectric material (silicon dioxide in this example) can be straight or have an inclined plane, for example from 15° to 20° with respect to the plane of the upper surface of the upper layer 12.

Generally, the definition of the trenches 21 and the filling ensure that the dielectric element(s) coming from the formation of this dielectric material are exposed at the surface of the upper layer 12. Thus, on at least one portion of the thickness of the upper layer 12, certain zones of it up to the surface thereof are insulated.

At the same time, the filling of the trenches 22 is intended to preserve, in these, a sacrificial material then removed to release portions of the device.

The interest of the invention is to be able to implement electrically conductive portions in the microelectronic device, while benefiting from an insulation against parasitic capacities.

The formation of certain conductive portions is illustrated in FIGS. 7 and 8a, 8b with the production of a second electrode 3, for example, made of molybdenum. The electrode(s) 3 (four in the example) can be deposited on portions at the level of which the oxide has been deposited, or also, as in the example of FIG. 8, on a sublayer 31 of dielectric nature deposited preliminarily at the deposition of the material of the conductive portion 32 of the second electrode 3. The dielectric material of the layer 31 can be aluminium nitride. According to another possibility, the material of the electrode 3 is in electrical continuity with that of the semi-conductive upper layer 12. Or also, one portion at least of the layer 12 forms the electrode 3. Thus, rather than providing an electrode 3 electrically insulated from the upper layer 12, it is possible to constitute at least partially the latter by the material of the upper layer 12.

The second electrode(s) 3 is/are in this example, located in zones at the level of which mechanical stresses will be observed. Indeed, the given example relates to an electromechanical device having a mobile portion of which the final definition will be given later, this mobile portion being anchored relative to the remainder of the device forming the support thereof and movement detection means being placed in at least one of these anchoring zones. More specifically, in the example considered here, the detection means comprise a plurality of sensors of piezoelectric nature comprising, in a stack, a second electrode, a layer with piezoelectric properties and a first electrode. It is understood, that the movements of the mobile portion of the sensor are measured in the zones equipped with the piezoelectric capacitive stacks in question, so as to measure the amplitude of the movement of the mobile portion.

Thus, the second electrodes 3 can form a first conduction level, typically metal, in the assembly of the device of the invention. To insulate this first level relative to the continuation of the stack, the invention proposes the deposition of a layer of a dielectric material, advantageously produced as a solid plate and represented under the reference 4 in FIG. 9. Aluminium nitride or another material having dielectric properties and advantageously, piezoelectric properties, can be used. Thus, in one single step, an electrical insulation of the first metal level and the formation of a piezoelectric layer are produced, with the intention of forming the intermediate layer of the capacitive stacks of the sensors of the electromechanical device.

Before this deposition, according to a first option, electrical conduction lines have been produced from the second electrodes 3 up to the re-contact elements, such as, electrical connection pads of the device. These electrical redistribution lines and the pads themselves or pads can be produced in keeping with the electrodes 3 and run to the upper surface of the upper layer 12. Another option, corresponding to the example represented in FIG. 10 is to constitute electrical passages through the thickness of the layer 4 so as to operate an electrical redistribution of the first metal level corresponding to the second electrodes 3 from the top of the dielectric material layer 4. Thus, FIG. 11 shows, in detail, a via passing through the layer 4 and connecting a second electrode 3 to the surface of the layer 4. Likewise, FIG. 10 illustrates a plurality of passages passing through the layer 4 and forming openings 7 likely to connect the device to the earth.

The following step is illustrated in FIG. 12 with the formation of a second electrical conduction level above the layer 4. In particular, first electrodes 10 are formed, corresponding to the second electrodes 3 produced beforehand, so as to finalise the stacks of two electrodes and the inserted piezoelectric material. The second conductive level further comprises connection lines 82 of the upper level making it possible to connect the first electrodes 10 to re-contact elements 81. In this example, the electrical connection of the second underlying electrodes 3 is furthermore carried out from the top of the layer 4. FIG. 12 gives an illustration of this with connection lines 84 and re-contacts 83 making it possible for the connection of the lower electrical level through the vias 6. A re-contact 85 is provided for the connection to the earth, in the electrical continuity of the openings 7 which are themselves filled with an electrical conduction material.

During all these steps, the layer 4 is used as an electrically insulating layer to make the electrical elements run between the electrodes and the re-contacts. The mechanical releasing of a mobile portion 9 of the sensor can then be carried out. The example given in FIGS. 13a and 13b show a partial removal of the material of the layer 4 so as to let the upper surface of the upper layer 12 reappear in certain places and so as to expose the trenches 22. At the same time, the other portions of the device and in particular, the zones comprising the dielectric elements formed at least partially by the trenches 21 are left covered with residual material 40 of the layer 4, they are therefore protected during this step. FIG. 13a is the illustration of this. It will be noted, that the trenches 22 have embedded end portions defining suspension arms of the mobile portion 9, these arms forming anchoring zones of the portion relative to the support. It is in this level that the detection stacks are located, comprising a first electrode 10, a second electrode 3 and a piezoelectric layer. The zone(s) corresponding to these anchorings, or suspension arms, also remain covered with the material of the layer 4 and the trenches 22 framing this zone are exposed.

A result of this step is provided in FIGS. 14 to 16 called release of the mobile portion. More specifically, FIG. 15 shows a trench 22 wherein the filling material has been removed. Typically, when this is silicon oxide, the removal can be carried out by a hydrofluoric acid wet etching. FIG. 16 shows other released portions of other trenches 22. At the same time, these figures illustrate that the dielectric elements 2 are protected by the dielectric layer 40 having been preserved from the partial removal of the solid plate dielectric layer 4.

The layer 40 fully covers the dielectric element(s) 2 such that the hydrofluoric acid attack does not impact this portion.

These cross-sectional figures furthermore make it possible to view the capacitive stack formed between the metal elements forming the re-contacts 81 and the connection lines 82 and the underlying layers, in particular the upper layer of semi-conductive material 12. Thus, in FIG. 16, the re-contact 81 is superposed to the upper layer 12 with the layer 40 and the dielectric element 2 located intermediately by producing capacities in series, making it possible to decrease the parasitic capacity produced by this portion of the device.

It will be noted, that in the example of embodiments illustrated in FIGS. 15 and 17, the protective layer 40 covers the dielectric element 2 simultaneously to other portions of the device to produce detection stacks which comprises a second electrode 3, a first electrode 10 and the inserted piezoelectric material. Thus, even if this characteristic is not limiting of the invention, it is advantageous to use, as a dielectric layer 40, a material of piezoelectric nature which could be deposited during a step being used both to constitute the piezoelectric layer, sensors and the dielectric layer 40 for protecting dielectric elements 2.

These figures present an embodiment of the dielectric element 2 further comprising a portion integrated in the thickness of the upper layer 12, a portion on the surface of the latter. This surface portion forms a second dielectric element portion 2 referenced 23 in FIG. 15 for illustration, the trenches 21 forming a first portion.

FIGS. 17 to 20 show other embodiment examples of the invention with dielectric elements 2 flush with the surface of the upper layer 12 without exceeding it.

A first case corresponding to FIGS. 17 and 18 shows the definition of a trench 21 around an electrical portion, in the example, a re-contact element 81, and around a connection line 82 starting from this re-contact 81. Thus, the electrical portions are surrounded by at least one trench 21 forming a first electrical insulation portion limiting the parasitic capacities. Further to this portion, a grid pattern of oxides is formed below the layer 40 by a network of lines and columns of trenches passing through the thickness of the upper layer 12, preferably up to the dielectric portion 11. This grid pattern defines pillars 25 made of a semi-conductive material of the layer 12. The dielectric network thus constituted forms a plurality of parasitic capacities combining additional dielectric capacities in series with the parasitic capacities and highly reducing the latter. According to an embodiment, the dielectric network coming from this grid pattern is fully located in a space defined to the right of, which can be equivalently said upright of, the electrically conductive elements, here the elements 81, 82.

FIGS. 19 and 20 show another structure possibility of such a network, produced this time negatively relative to the preceding case, namely that the pillars produced in the thickness of the upper layer 12, are this time pillars in the dielectric material, typically silicon dioxide. One or more trenches 21 can be defined as above.

Advantageously, this or these trench(es) is/are to the right of, which can be equivalently said upright of, the edge of the electrical connection element superposed at the dielectric layer or at the periphery of the projection of this edge according to the thickness of the substrate, but always below the dielectric layer 40.

REFERENCES

1. Substrate
10. Base portion
11. Dielectric portion
12. Upper layer
2. Dielectric element
21. First portion trench
22. Mobile portion definition trench
23. Second portion
24. Pillar
25. Semi-conductive pillar
3. Second electrode
31. Dielectric sublayer
32. Conductive portion
4. Solid plate dielectric deposition
40. Dielectric layer
5. Oxide
6. Via
7. Opening
81. Upper level re-contact
82. Upper level connection line
83. Lower level re-contact
84. Lower level connection line
85. Earth re-contact
9. Mobile portion
100. First electrode

The invention claimed is:

1. A microelectronic device, comprising:
   a substrate comprising, in a stack, a base portion, a dielectric portion, and an upper layer with a semi-conductive material base;
   at least one electrical connection element made of an electrically conductive material located above the upper layer and electrically insulated from the upper layer at least by a dielectric layer, the dielectric layer being in contact with a surface of the upper layer; and
   at least one dielectric element comprising at least one trench forming a closed edge at a periphery or upright of at least one portion of the at least one electrical connection element, located at least partially in the upper layer and delimiting a closed zone of said upper layer, the at least one dielectric element having a portion exposed to the surface of the upper layer, wherein the dielectric layer totally covers the exposed portion of the at least one dielectric element.

2. The device according to claim 1, wherein the at least one dielectric element and the dielectric layer are made of different materials.

3. The device according to claim 2, wherein the at least one dielectric element is made of silicon dioxide, and wherein the dielectric layer is resistant to a hydrofluoric acid etching.

4. The device according to claim 1, wherein the at least one electrical connection element is in electrical continuity with a first electrode of a capacitive stack.

5. The device according to claim 4, wherein the capacitive stack comprises a second electrode located below a portion of the dielectric layer, at least one portion of the first electrode being located facing the second electrode and insulated from the second electrode by said portion of the dielectric layer.

6. The device according to claim 5, wherein a dielectric sublayer is located between the upper layer and the second electrode.

7. The device according to claim 5, further comprising an additional electrical connection element made of an electrically conductive material located above the upper layer and electrically insulated from the upper layer at least by a zone of the dielectric layer, the additional electrical connection element being in electrical continuity with the second electrode by a via passing through the dielectric layer.

8. The device according to claim 1, wherein the dielectric layer is of piezoelectric nature.

9. The device according to claim 1, wherein the at least one dielectric element further comprises at least one pillar of which a long dimension extends according to at least one portion of a thickness of the upper layer.

10. The device according to claim 9, wherein the at least one pillar is located facing the at least one electrical connection element under the dielectric layer.

11. The device according to claim 1, wherein the at least one dielectric element further comprises a network of trenches defined as hollow in a thickness of the upper layer around a plurality of pillars extending at least into the thickness of the upper layer.

12. The device according to claim 11, wherein at least one pillar of the plurality of pillars is located facing the at least one electrical connection element under the dielectric layer.

13. The device according to claim 9, wherein at least one trench surrounds the at least one pillar.

14. The device according to claim 1, wherein the at least one dielectric element further comprises a plurality of trenches.

15. The device according to claim 1, wherein the at least one dielectric element further comprises a first portion located in the upper layer and a second portion located above the upper layer.

16. The device according to claim 1, wherein the at least one electrical connection element comprises a connection pad.

17. The device according to claim 1, wherein the dielectric layer is wider than the at least one electrical connection element, and wherein the at least one dielectric element is located facing a portion of the dielectric layer not covered by the at least one connection element.

18. The device according to claim 1, wherein the at least one dielectric element passes through a whole thickness of the upper layer and joins the dielectric portion.

19. A method for producing a microelectronic device comprising a substrate comprising, in a stack, a base portion, a dielectric portion, and an upper layer with a semi-conductive material base, the method comprising:
   forming at least one dielectric element located at least partially in the upper layer, the at least one dielectric element having a portion exposed to a surface of the upper layer, the at least one dielectric element comprising at least one trench delimiting a closed zone of the upper layer, at a periphery or upright of at least one portion of the at least one electrical connection element;

forming a dielectric layer in contact with the surface of the upper layer and which totally covers the exposed portion of the at least one dielectric element; and forming at least one electrical connection element made of an electrically conductive material above the upper layer and electrically insulated from the upper layer at least by the dielectric layer.

20. The method according to claim 19, further comprising forming at least one zone made of a sacrificial material in the upper layer, then etching the sacrificial material, while the at least one dielectric element is covered by the dielectric layer.

21. The method according to claim 20, wherein the forming of the at least one zone made of the sacrificial material is carried out before the forming of the dielectric layer, simultaneously to the forming of the at least one dielectric element.

22. The method according to claim 21, wherein the forming of the dielectric layer comprises a solid plate deposition, then an etching configured to preserve a material of the dielectric layer above the at least one dielectric element without preserving the material of the dielectric layer above the at least one zone made of the sacrificial material.

\* \* \* \* \*